United States Patent
Mansueto

(10) Patent No.: US 6,619,766 B1
(45) Date of Patent: Sep. 16, 2003

(54) DEVICE MOUNTING AND RETENTION ASSEMBLY

(75) Inventor: Richard Mansueto, Laguna Hills, CA (US)

(73) Assignee: Gateway, Inc., Poway, CA (US)

(*) Notice: Subject to any disclaimer, the term of this patent is extended or adjusted under 35 U.S.C. 154(b) by 0 days.

(21) Appl. No.: 09/416,547

(22) Filed: Oct. 12, 1999

(51) Int. Cl.$^7$ .............................................. A47B 81/06
(52) U.S. Cl. ................................... 312/223.1; 312/333
(58) Field of Search .................. 361/685, 727, 361/732, 810; 174/51; 312/330.1, 333, 334.16, 334.22, 334.36, 334.44, 334.46

(56) References Cited

U.S. PATENT DOCUMENTS

| | | | | |
|---|---|---|---|---|
| 1,527,282 A | * | 2/1925 | Steadman ................ 312/330.1 |
| 1,563,864 A | * | 12/1925 | Juvet .................... 312/334.36 |
| 4,441,771 A | * | 4/1984 | Roesler ................. 312/330.1 |
| 4,532,564 A | | 7/1985 | Larson et al. ............... 360/97 |
| 4,896,777 A | | 1/1990 | Lewis ......................... 211/41 |
| 4,914,550 A | | 4/1990 | Filsinger et al. ............ 361/386 |
| 4,960,384 A | | 10/1990 | Singer et al. ............... 439/155 |
| 4,980,800 A | | 12/1990 | Furuta ........................ 361/391 |
| 5,003,431 A | | 3/1991 | Imsdahl ..................... 361/415 |
| 5,031,070 A | | 7/1991 | Hsu ........................... 361/380 |
| 5,067,041 A | | 11/1991 | Cooke et al. ............... 361/394 |
| 5,083,931 A | | 1/1992 | Davidge et al. ............ 439/108 |
| 5,098,175 A | | 3/1992 | Cooke et al. ............... 312/341.1 |
| 5,100,215 A | | 3/1992 | Cooke et al. ............... 312/257.1 |
| 5,112,119 A | | 5/1992 | Cooke et al. ............... 312/283 |
| 5,121,296 A | | 6/1992 | Hsu ........................... 361/395 |
| 5,142,447 A | | 8/1992 | Cooke et al. ............... 361/394 |
| 5,164,886 A | | 11/1992 | Chang ........................ 361/390 |
| 5,175,670 A | | 12/1992 | Wang ......................... 361/390 |
| 5,216,582 A | | 6/1993 | Russell et al. .............. 361/395 |
| D338,664 S | | 8/1993 | Goff .......................... D14/114 |
| 5,253,129 A | | 10/1993 | Blackborow et al. ......... 360/69 |
| 5,269,698 A | | 12/1993 | Singer ....................... 439/157 |
| 5,277,615 A | | 1/1994 | Hastings et al. ............ 439/377 |
| 5,299,095 A | | 3/1994 | Feuerlein et al. ........... 361/801 |
| 5,299,944 A | | 4/1994 | Larabell et al. ............. 439/157 |
| 5,321,962 A | | 6/1994 | Ferchau et al. ............... 70/208 |
| 5,325,263 A | | 6/1994 | Singer et al. ............... 361/683 |
| 5,332,306 A | | 7/1994 | Babb et al. ............ 312/334.16 |
| 5,333,097 A | | 7/1994 | Christensen et al. ........ 361/685 |
| 5,340,340 A | | 8/1994 | Hastings et al. .............. 439/64 |
| 5,349,483 A | | 9/1994 | Tsai ........................ 360/97.01 |
| 5,379,184 A | | 1/1995 | Barraza et al. ............. 361/685 |
| 5,392,192 A | | 2/1995 | Dunn et al. ................. 361/683 |
| 5,481,431 A | | 1/1996 | Siahpolo et al. ............ 361/685 |
| 5,495,389 A | | 2/1996 | Dewitt et al. ............... 361/683 |
| 5,502,604 A | | 3/1996 | Furay ....................... 360/97.01 |
| 5,510,955 A | | 4/1996 | Taesang ..................... 361/685 |
| 5,518,412 A | | 5/1996 | Larabell .................... 439/157 |
| 5,524,104 A | | 6/1996 | Iwata et al. ................. 369/77.2 |
| 5,557,499 A | | 9/1996 | Reiter et al. ................ 361/685 |
| 5,564,585 A | | 10/1996 | Saitoh ....................... 220/241 |
| 5,566,049 A | | 10/1996 | Nguyen ..................... 361/685 |
| 5,566,383 A | | 10/1996 | Gildea et al. ............... 361/685 |

(List continued on next page.)

Primary Examiner—Lanna Mai
Assistant Examiner—Jerry A. Anderson
(74) Attorney, Agent, or Firm—Walter J. Malinowski; Mark S. Walker

(57) ABSTRACT

A device mounting and retention mechanism is disclosed, comprising a guide disposed on a device so that the guide is capable of slidably moving along a guide channel so that a retention mechanism may engage the guide thereby providing a restraining force and ground for the device. A device retention assembly is also disclosed, comprising a guide mounted on a device so that the guide is capable of slidably moving along a guide channel disposed on a housing so that the retention mechanism is capable of flexibly engaging the guide, thereby providing a restraining force. A device mounting assembly is also disclosed, comprising a first guide mounted on a device and a second guide mounted on a device wherein a guide channel is formed so as to selectively accept the first guide and exclude acceptance of the second guide.

20 Claims, 10 Drawing Sheets

U.S. PATENT DOCUMENTS

| | | | | |
|---|---|---|---|---|
| 5,571,256 A | 11/1996 | Good et al. | ................ | 211/26 |
| 5,586,003 A | 12/1996 | Schmitt et al. | ............ | 361/683 |
| 5,587,856 A | 12/1996 | Aoyama | ................ | 360/99.02 |
| 5,588,728 A | 12/1996 | Eldridge et al. | ......... | 312/332.1 |
| 5,599,080 A | 2/1997 | Ho | ......................... | 312/334.7 |
| 5,602,696 A | 2/1997 | Hanson | ................... | 360/97.01 |
| 5,652,695 A | 7/1997 | Schmitt | ..................... | 361/685 |
| 5,652,697 A | 7/1997 | Le | ............................. | 361/788 |
| 5,653,518 A | 8/1997 | Hardt | ..................... | 312/334.4 |
| 5,673,171 A | 9/1997 | Varghese et al. | ............ | 361/685 |
| 5,673,172 A | 9/1997 | Hastings et al. | ............ | 361/685 |
| 5,680,293 A | 10/1997 | McAnally et al. | .......... | 361/685 |
| 5,680,295 A | 10/1997 | Le et al. | ..................... | 361/695 |
| 5,682,291 A | 10/1997 | Jeffries et al. | ............. | 361/1.85 |
| 5,683,159 A | 11/1997 | Johnson | ................... | 312/334.7 |
| 5,687,059 A | 11/1997 | Hoppal | ...................... | 361/685 |
| 5,694,266 A | 12/1997 | Bloom et al. | ............ | 360/97.01 |
| 5,713,647 A | 2/1998 | Kim et al. | ............... | 312/223.2 |
| 5,717,571 A | 2/1998 | Helot | ........................ | 361/685 |
| 5,724,227 A | 3/1998 | Hancock et al. | ............ | 361/685 |
| 5,726,864 A | 3/1998 | Copeland et al. | ........... | 361/800 |
| 5,726,922 A | 3/1998 | Womble et al. | ............ | 364/708.1 |
| 5,734,557 A | 3/1998 | McAnally et al. | .......... | 361/727 |
| 5,737,185 A | 4/1998 | Morrison et al. | ........... | 361/685 |
| 5,751,551 A | 5/1998 | Hileman et al. | ............ | 361/753 |
| 5,755,497 A | 5/1998 | Chang | .................... | 312/223.2 |
| 5,764,480 A | 6/1998 | Crump et al. | ................ | 361/685 |
| 5,767,445 A | 6/1998 | Wu | ........................... | 174/52.1 |
| 5,768,097 A | 6/1998 | Jelinger | ...................... | 361/683 |
| 5,779,496 A | 7/1998 | Bolinger et al. | ............ | 439/377 |
| 5,783,771 A | 7/1998 | Copeland et al. | ......... | 174/35 R |
| 5,785,402 A | 7/1998 | DeLorenzo | ................ | 312/350 |
| 5,790,373 A | 8/1998 | Kim et al. | ................... | 361/685 |
| 5,801,920 A | 9/1998 | Lee | ............................. | 361/685 |
| 5,805,420 A | 9/1998 | Burke | ........................ | 361/727 |
| 5,808,864 A | 9/1998 | Jung | .......................... | 361/685 |
| RE35,915 E | 10/1998 | Hastings et al. | ............ | 439/377 |
| 5,828,546 A | 10/1998 | Tierrell et al. | ............... | 361/685 |
| 5,828,547 A * | 10/1998 | Francovich et al. | ........ | 361/685 |
| 5,833,337 A | 11/1998 | Kofstad | .................... | 312/334.5 |
| 5,850,925 A | 12/1998 | Gandre | ........................ | 211/26 |
| 5,852,739 A | 12/1998 | Radloff et al. | ......... | 395/800.01 |
| 5,865,518 A | 2/1999 | Jarrett et al. | ............... | 312/223.2 |
| 5,867,369 A | 2/1999 | Antonuccio et al. | ........ | 361/796 |
| 5,875,068 A | 2/1999 | Sawada | ................... | 360/99.01 |
| 5,877,938 A | 3/1999 | Hobbs et al. | ................ | 361/724 |
| 5,886,869 A | 3/1999 | Fussell et al. | ............... | 361/685 |
| 5,896,273 A | 4/1999 | Varghese et al. | ............ | 361/724 |
| 5,914,854 A | 6/1999 | Holt | .......................... | 361/683 |
| 5,914,855 A | 6/1999 | Gustafson et al. | .......... | 361/685 |
| 6,362,955 B2 * | 3/2002 | Felcman et al. | ............ | 361/683 |

\* cited by examiner

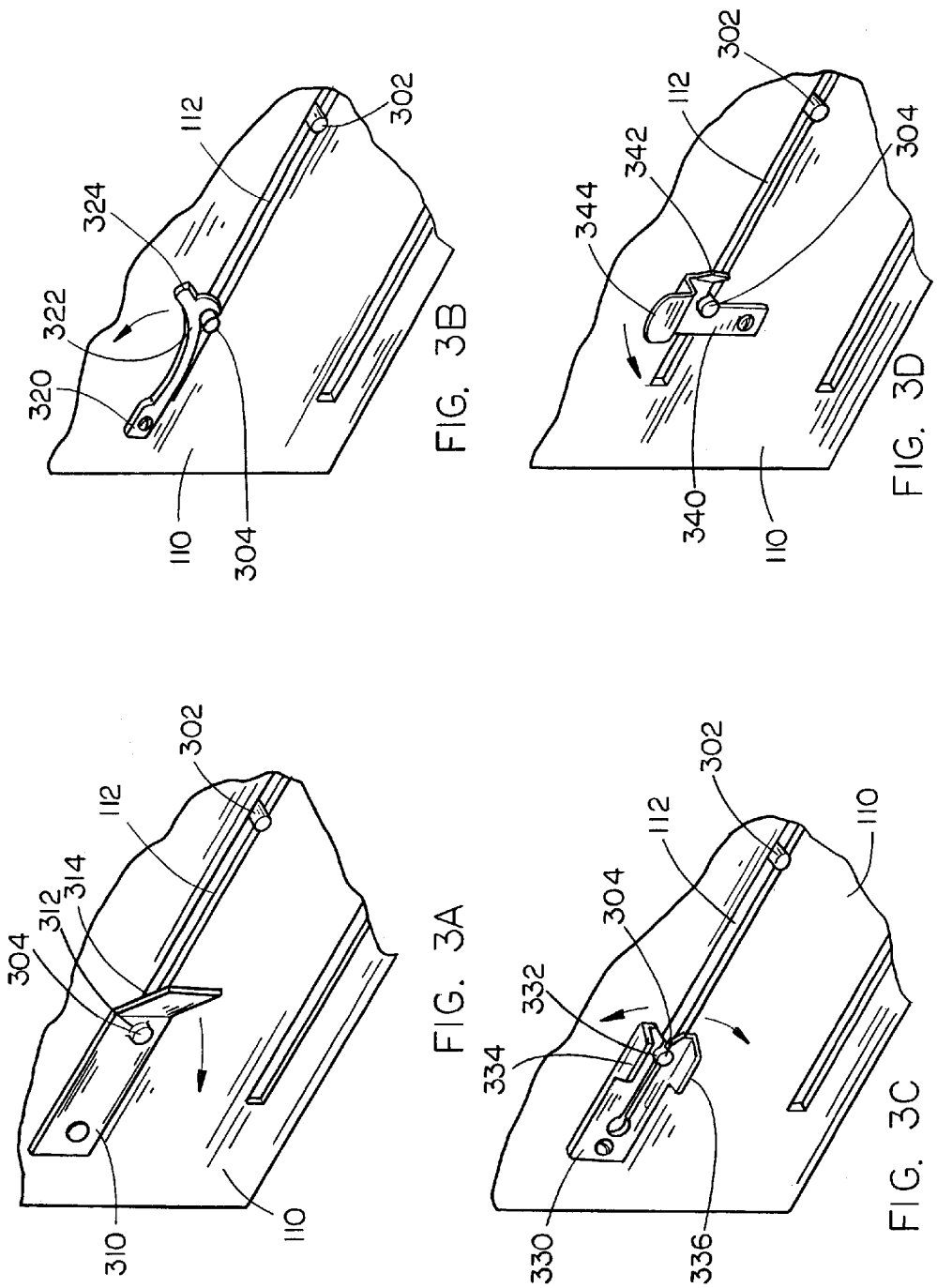

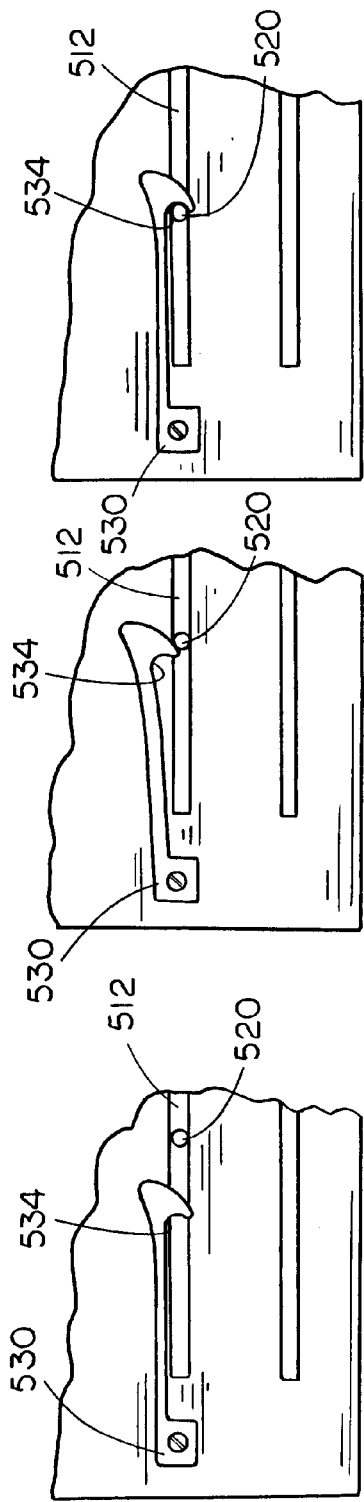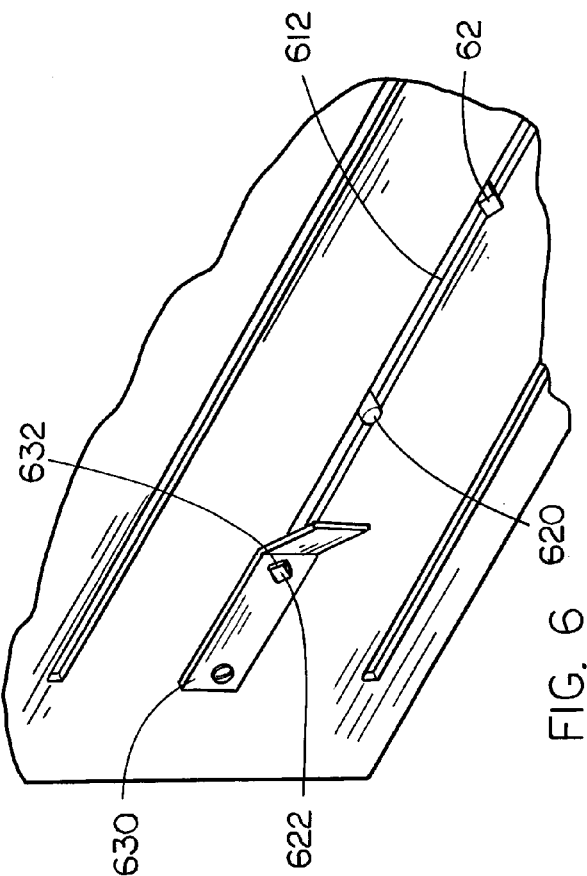

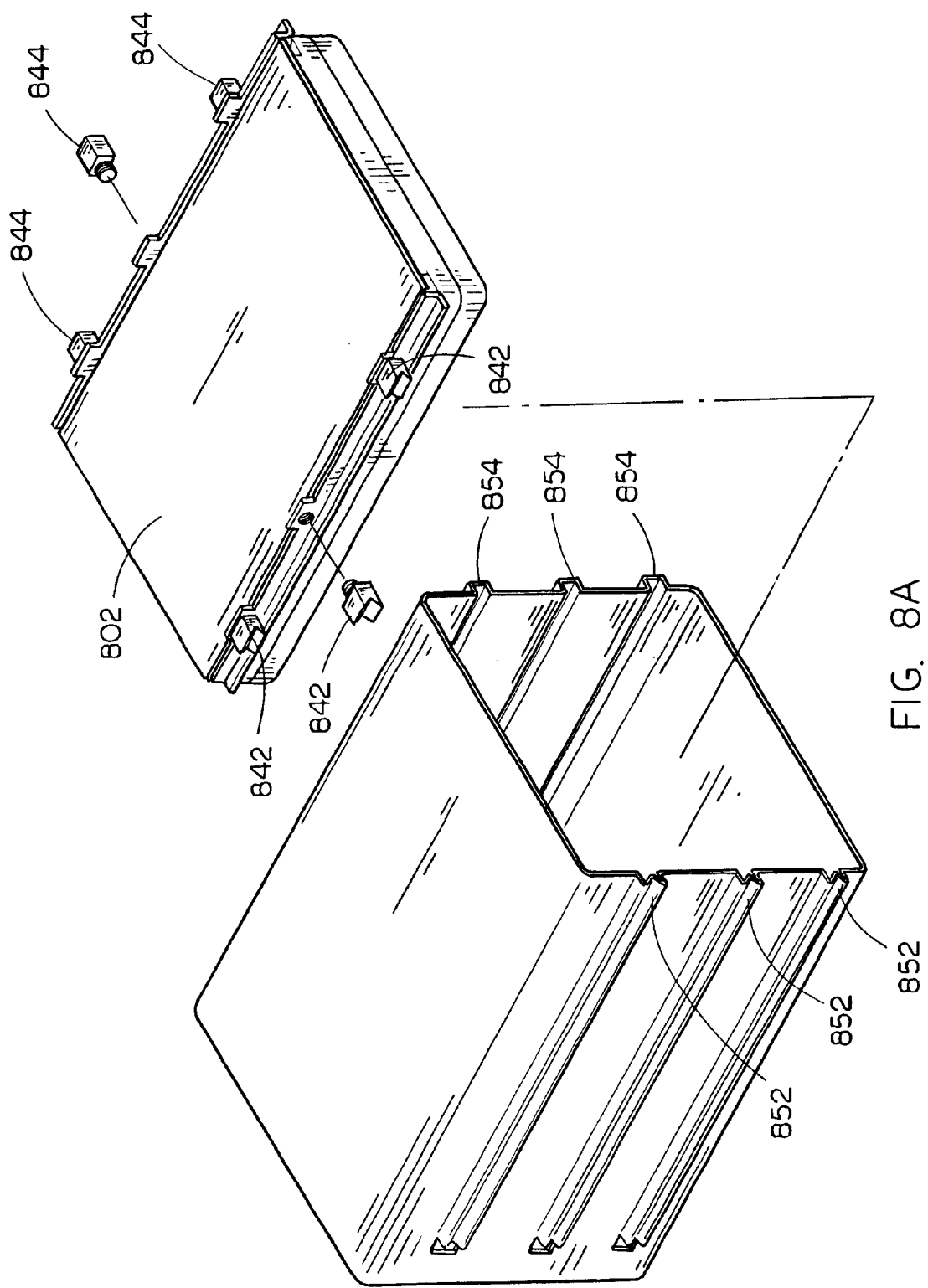

DEVICE MOUNTING AND RETENTION ASSEMBLY

FIELD OF THE INVENTION

The present invention generally relates to the field of mounting assemblies, and particularly to device mounting and retention assemblies.

BACKGROUND OF THE INVENTION

In the past, devices such as hard disk drives and other components were mounted in a housing, such as in an information handling system or convergence system, etc., by using screws to attach the device to holes contained on the housing. This method is time-consuming, expensive, and inefficient. To install or replace a device in a housing necessitated locating and removing all retaining screws, then manually replacing the screws to install a new device. Other methods intended to address this problem involve complicated retention systems. Some systems involve complicated parts that are incapable of selectively permitting the removal of a device, while retaining other devices contained in the housing. Other systems include trays that prevent efficient distribution of heat and/or fail to provide a suitable ground for the device.

It is the intention of the present invention to present an improved device retention assembly. By providing mounting guides that are capable of sliding through a guide channel, the device may be installed or removed more efficiently. The guides may be shaped as posts and mounted in mounting holes contained on the device to further simplify the structure. A retention mechanism disposed on the housing may engage the guide therein, providing a restraining force to provide stability and prevent removal of the device. The retention mechanism may be formed in a more simplified manner, thereby lowering production costs. For example, the retention mechanism may be formed as one piece mounted to the housing. Furthermore, the retention mechanism may be formed as an integral part of the housing, so the housing and retention mechanism may be formed in one process. In this way, the invention provides a simplified mounting and retention structure with electrical grounding capabilities. By forming the retention mechanism in the complementary shape of a guide, the retention mechanism may selectively engage a particular guide, thereby promoting correct orientation and proper installation of the device.

Additionally, a guide channel may be formed in the complementary shape of a guide so as to selectively allow movement of the particular guide through the guide channel, yet exclude other guides from entering the guide channel. The guide channel may also be strategically located to promote proper front-to-back installation of the device. The guide channel may also have a complementary size, such as width or height, to selectively allow movement of a particular guide through the guide channel, yet exclude other guides from entering the channel. In this way, the invention may promote the proper installation of the device in the housing and specialize different positions in a housing for different devices.

For the foregoing reasons, there is a need for a device mounting and retention assembly that may facilitate the efficient and correct orientation of a device for installation and removal.

SUMMARY OF THE INVENTION

The present invention is directed to a device mounting and retention assembly comprising a guide disposed on a device wherein the guide is capable of slidably moving along a guide channel so a retention mechanism may engage the guide thereby providing a restraining force and ground for the device.

The present invention is further directed to a device retention assembly comprising a guide mounted on a device wherein the guide is capable of slidably moving along a guide channel disposed on a housing so the retention mechanism is capable of flexibly engaging the guide, thereby providing a restraining force.

The present invention is further directed to a device mounting assembly comprising a first guide mounted on a device and a second guide mounted on a device wherein a guide channel is formed so as to selectively accept the first guide and exclude the second guide.

It is to be understood that both the forgoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which:

FIGS. 3A, 3B, 3C, and 3D are views of various retention mechanisms capable of being utilized by the present invention;

FIGS. 5A, 5B and 5C are progressive views of an exemplary embodiment of the present invention;

FIG. 6 is a view of an exemplary retention mechanism capable of selectively engaging a guide;

FIGS. 8A, 8B, 8C, and 8D are views of an exemplary embodiment of the present invention wherein the guide channels are formed to selectively engage a guide.

DETAILED DESCRIPTION OF THE INVENTION

Reference will now be made in detail to presently preferred embodiments of the invention, examples of which are illustrated in the accompanying drawings.

A variety of devices, such as electronic devices, are mounted in information handling systems and convergence systems, etc. to add the functionality of the device to the system. However, past mounting methods often involved complicated processes of manufacture and assembly. In some cases, the device had to be mounted to the system by using screws. Other types of systems that have attempted to address this problem involved components that must also be assembled and installed in the desired system. The present invention addresses these problems by forming a simplified retention mechanism that may be capable of providing an electrical ground for the device. This invention may be useful in a variety of applications such as server assemblies, hard-drive arrays, personal computers, or any other system where space and convenience of operation is a concern.

Figure 1:
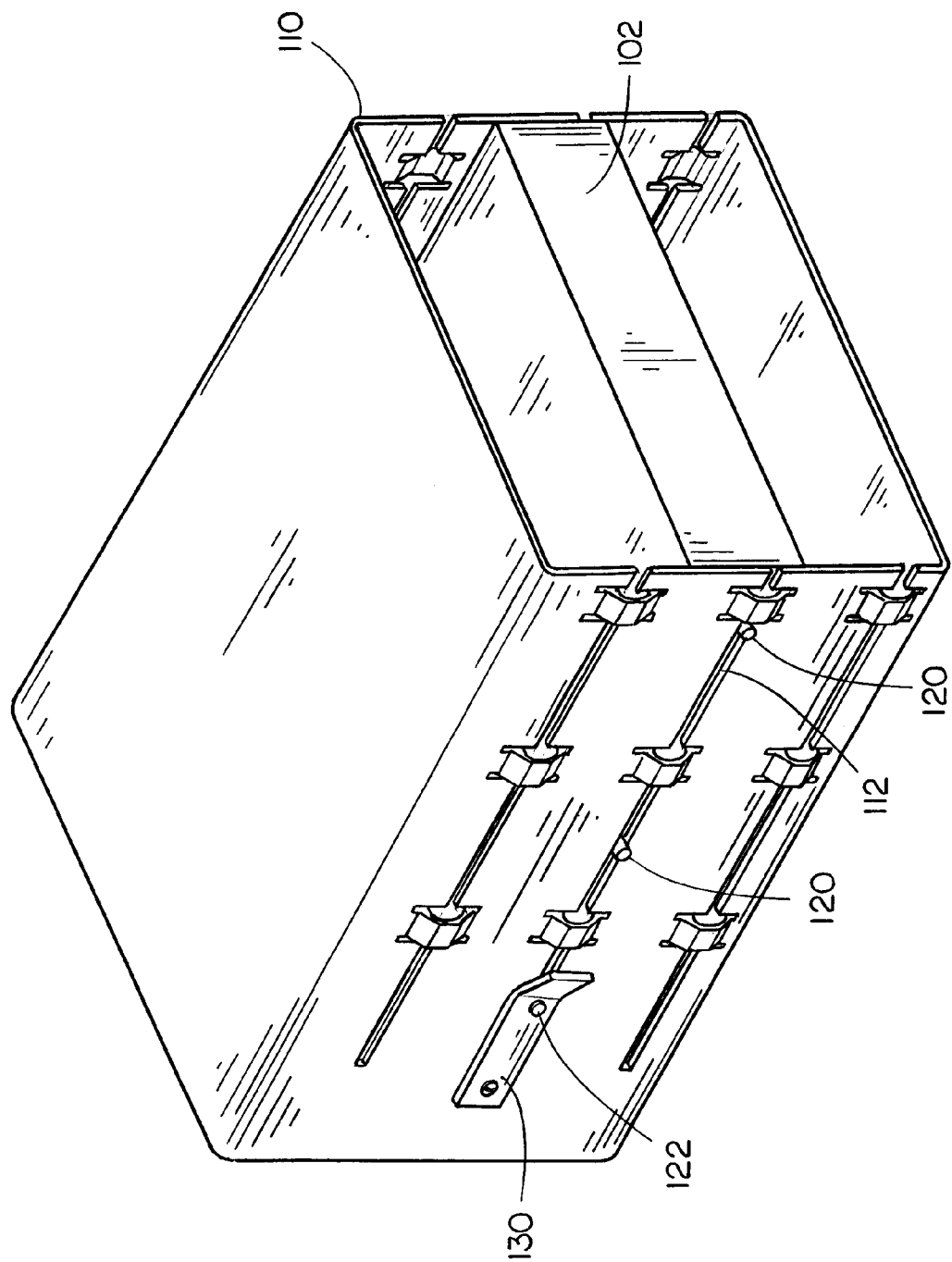
FIG. 1 is a perspective view of an exemplary embodiment of the present invention.

In FIG. 1, an exemplary embodiment of the present invention is shown. A device 102 is mounted in a housing 110. A plurality of guides 120 and 122 allow the device 102 to slide along a guide channel 112 formed on the housing 110. A retention mechanism 130 is also disposed on the housing 110. The retention mechanism 130 engages the guide 122 thereby providing a restraining force to selectively prevent removal of the device 102. The retention mechanism may also provide an electrical ground by engaging the guide 122 on the device 102. In this embodiment, the plurality of guides 120 and 122 may be installed on the device 102 economically, yet provide the capability of slidably installing and removing the device 102 along the guide channels 112 on the housing 110. By forming the guides 120 and 122 in this manner, the device 102 has a greater surface area exposed, thereby increasing the efficiency of heat distribution. For example, it may be preferable to locate a cooling fan (not shown) near the housing 110 so the device may be cooled more efficiently. Additionally, the retention mechanism 130 may be formed to selectively engage the guide 122, and therefore the device 102, for ease of removal. For example, the retention mechanism 130 may be manually flexed so as to disengage the retention mechanism 130 from the guide 122. This allows the device 102 to be slidably removed through the guide channel 112, thereby releasing the device 102 from the housing 110.

Figure 2A:
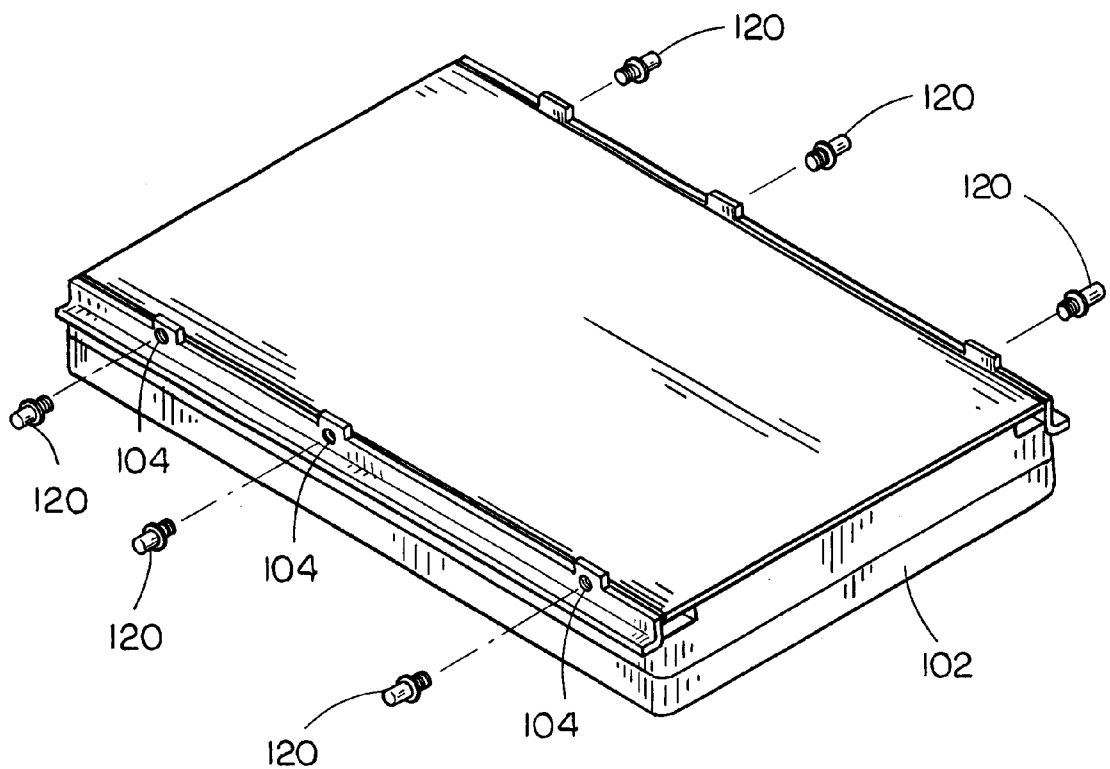
FIG. 2A is an exploded perspective view of a device.
Figure 2B:
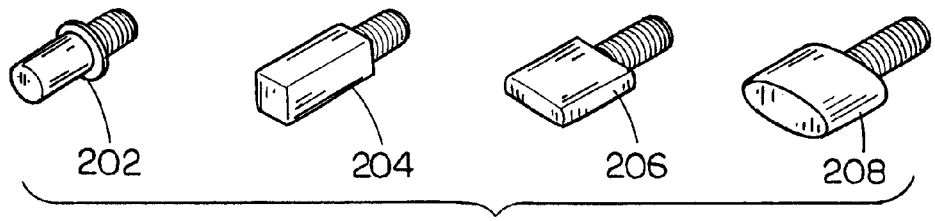
FIGS. 2B and 2C depict exemplary guides capable of being utilized by the present invention.
Figure 2C:
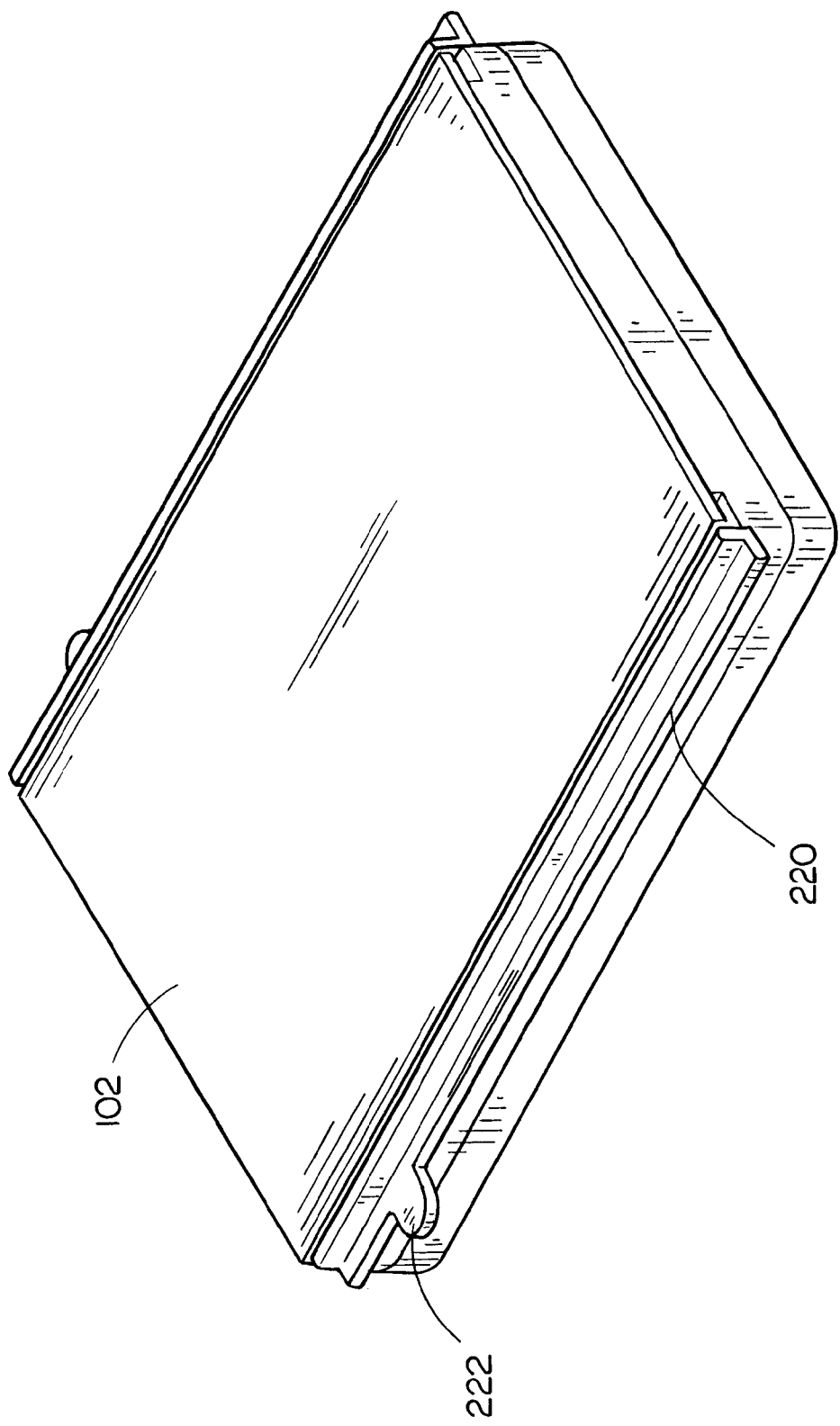

There are a variety of guides that may be utilized by the present invention. In an exemplary embodiment, as shown in FIG. 2A, a plurality of guides 120 may be mounted on the device with the use of mounting holes 104 contained on the device 102. As shown in FIG. 2B, the guides may be substantially circular 202, square 204, substantially flat 206, substantially rounded 208 or any other shape that permits the device 102 to slide along the guide channel 112 (FIG. 1). It is understood that the guides 120 may also be formed as an integral part of the device 102 itself, thereby eliminating the need for an additional attachment step in a manufacturing process. Furthermore, a guide may be formed as a rail, as shown in FIG. 2C. In this example, the guide 220 is formed so as to slide along a guide channel 112 (FIG. 1). The guide may include a protrusion 222 so that the retention mechanism 130 (FIG. 1) may engage the protrusion 222, thereby providing a restraining force on the device 102. Alternatively, it might be preferable to forgo the use of a protrusion by utilizing pressure applied by the retention mechanism directly against the guide. The retention mechanism 130 may also provide an electrical ground for the device 102. Although the invention, and particularly the types of guides able to be utilized by the invention have been described with a certain degree of particularity, it should be recognized that elements thereof may be altered by persons skilled in the art without departing from the spirit and scope of the invention.

Referring now to FIGS. 3A through 3D, examples of various types of retention mechanisms that may be utilized by the present invention are shown. In FIG. 3A, the retention mechanism 310 is formed as a spring. The retention mechanism 310 includes a securing portion 312 to selectively engage the guide 304. The securing portion 312 may be formed as an indentation as in the present example or other complementary shape of a guide 304 wherein a greater restraining force may be achieved with the guide 304 so that the device 102 is better restrained. The securing portion may also be formed in any other form one of ordinary skill may substitute so as to engage the guide. It might be preferable to include a release portion 314 on the retention mechanism to ease device removal and installation. The release portion 314 may aid in flexing the retention mechanism 310 away from the guide 304 so as to disengage the device. It might be preferable to curve the release portion 314 away from the housing so that the retention mechanism 310 may automatically flex when a force is applied by a guide 304 against the retention mechanism 310 as the device 102 is slidably inserted along the guide channel 112. A securing portion 312 of the retention mechanism 310 may then automatically engage the guide 304, thereby providing a securing force. This enables the device 102 to be installed and mounted in the housing 110 in one quick and fluid motion. The retention mechanism 310 may also serve as a ground for the device 102. The retention mechanism may be disengaged from the guide by flexing the mechanism 310 away from the guide 304 with the use of a release portion 314 included on the mechanism 310. Once the guide 304 is disengaged from the retention mechanism 310, the device is free to slide along the guide channel 112 utilizing the guides 302 and 312 for the removal of the device 102.

Figure 4:
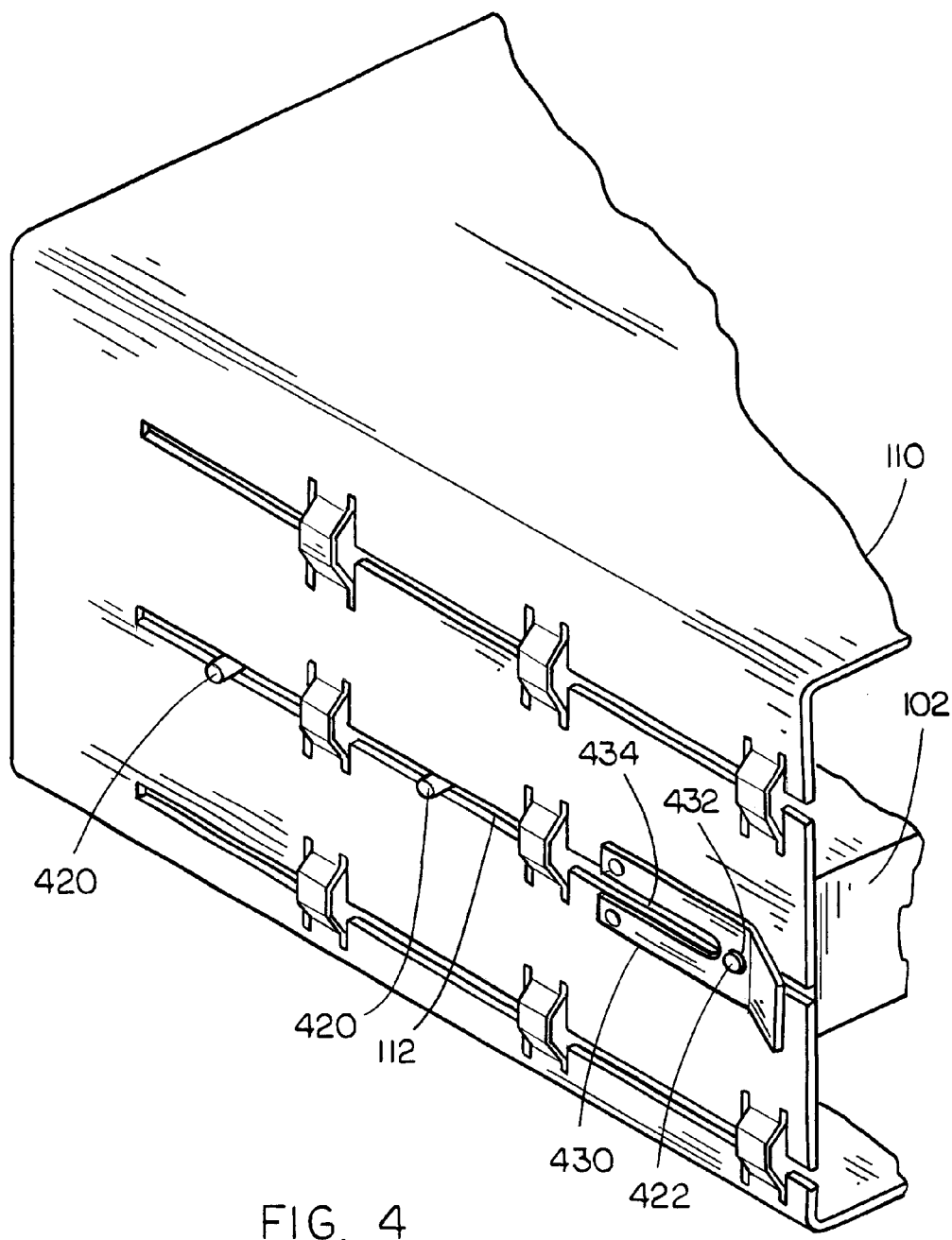
FIG. 4 is a partial perspective view of an exemplary embodiment of the present invention illustrating a retention mechanism mounted at the insertion point of the housing.

In FIG. 3B, a retention mechanism 320 has a substantially hook-like structure. The retention mechanism 320 includes a securing portion 322 to engage the guide 304. In this example, the retention mechanism 320 flexes substantially parallel to the housing 110 to engage and disengage the guide 304. This embodiment may be particularly useful for mounting the retention mechanism 320 near the entry point for the device 102 (as shown in FIG. 4) to allow a plurality of guides 302 and 304 to pass along the guide channel 112 uninterrupted. The retention mechanism 320 may include a release portion 324 to aid in disengaging the retention mechanism 320 from the guide 304.

In FIG. 3C, two grasping portions, a first grasping member 334 and a second grasping member 336, form a retention mechanism 330. These members are disposed on the housing 110 so as to be able to engage the guide 304 slidably moving along the guide channel 112. The first grasping member 334 and the second grasping member 336 are capable of flexible movement so as to permit entry of the guide 304. Once the guide 304 reaches the securing portion 332 formed by indentations in the grasping members, the first grasping member 334 and the second grasping member 336 may return to their original position thereby providing a restraining force on the guide 304.

In FIG. 3D, another type of retention mechanism is shown. In this example, the retention mechanism 304 is formed so that a release portion 344 may be utilized to flex the retention mechanism 304 away from the housing 110. The retention mechanism 304 also includes a portion 342 so that the retention mechanism 304 may be flexed when a guide sliding along the guide channel 112 applies pressure so that the retention mechanism 304 may engage the guide 304. It should be recognized that the retention mechanism may be altered into various forms by persons or ordinary skill in the art without departing from the spirit and scope of the invention.

A retention mechanism 430 may be mounted anywhere along the guide channel 112, as shown in FIG. 4, yet still provide a restraining force and electrical grounding capabilities. In this exemplary embodiment, the retention mechanism 430 is mounted toward the insertion point of the device 102. The retention mechanism 430 includes a securing portion 432 so a plurality of guides 420 may pass along the guide channel 112 of the housing 110 unimpeded by the retention mechanism 430. The retention mechanism 430 may be formed so as to allow a plurality of guides 420 to pass, for instance through a channel 434 formed in the retention mechanism 430, yet retain a specific guide 422 to secure the device 102 in the housing 110. By mounting the retention mechanism 430 toward the insertion point of the housing 110, less access to the internal reaches of the housing is needed to utilize the retention mechanism 430 so as to manually release the device 102.

Referring now to FIGS. 5A, 5B, and 5C, a progressive view of the operation of an exemplary retention mechanism is shown. In FIG. 5A, a retention mechanism 530 is shown disposed next to a guide channel 512. A guide 520 mounted on a device (not shown) slides along the guide channel 512 toward the retention mechanism 520. In FIG. 5B, the guide 520 makes initial contact with the retention mechanism 530 causing the guide to flex away from the guide channel 512 so as to allow the guide 520 to continue along the guide channel 512. Finally, in FIG. 5C, the guide 520 has passed the retention mechanism, allowing the retention mechanism to flex toward its original position. A securing portion 534 of the retention mechanism 530 engages the guide 520, thereby preventing reverse movement of the guide 520 along the guide channel 512. The retention mechanism may also serve as a ground for the device 102 (FIGS. 1 and 4) by providing contact between the device 102 and the housing 110 via the guide 520.

Referring now to FIG. 6, the retention mechanism is capable of selectively retaining a specific guide. The retention mechanism 630 is formed so that only a specific guide may fit into the securing portion 632 of the mechanism 630. The securing portion may be formed, for example, as a hole, indentation, cavity, or as any other type of structure capable of engaging a guide 620 or 622. In this example, the securing portion 632 is formed so that it is capable of engaging the specific guide 622 while enabling nonconforming guides 620 to continue past the retention mechanism 630 if the retention mechanism is placed in a forward position. This embodiment is particularly useful when mounting the retention mechanism toward the entry point for the device 102 (as shown in FIG. 4). The securing portion 632 may be formed in a variety of shapes, sizes, and orientations so as to selectively engage a specific guide. For example, the securing portion may be formed so as to receive a smaller guide while allowing larger guides to pass. In this way, the retention mechanism 630 will only allow the device 102 to be retained when correctly oriented in the housing 110. This also promotes the complete installation of the device 102 because the retention mechanism 630 will engage the specific guide 622 only when the device 102 is completely and properly inserted.

Figure 7:
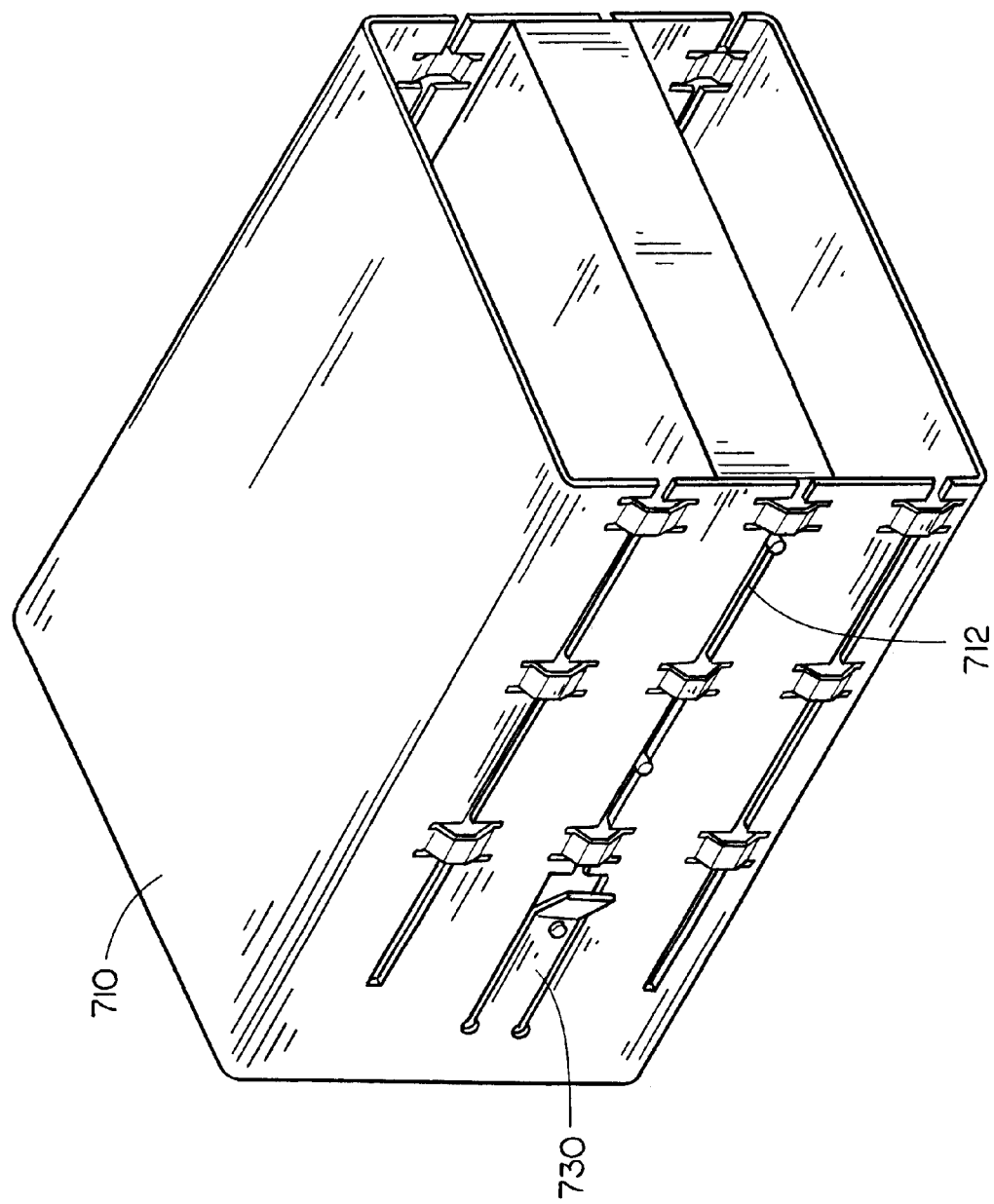
FIG. 7 is a perspective view of an exemplary retention mechanism formed as an integral part of a housing.

A retention mechanism 730 may be formed as an integral part of a housing 710, as shown in FIG. 7. In this exemplary embodiment, the retention mechanism 730 may be formed in the same manufacturing process as the housing 710 and/or guide channel 712. In this way, the retention mechanism 730 is formed without having to add another step in production and manufacturing processes. By eliminating the need for an extra manufacturing step, the device may be made more efficiently. As stated above, the guide may also be formed as an integral part of the housing in order to further lower production and manufacturing costs. Combining both of these features will further add to the efficiency of the manufacturing process, resulting in lower costs to both manufacturer and consumer.

Figure 8B:
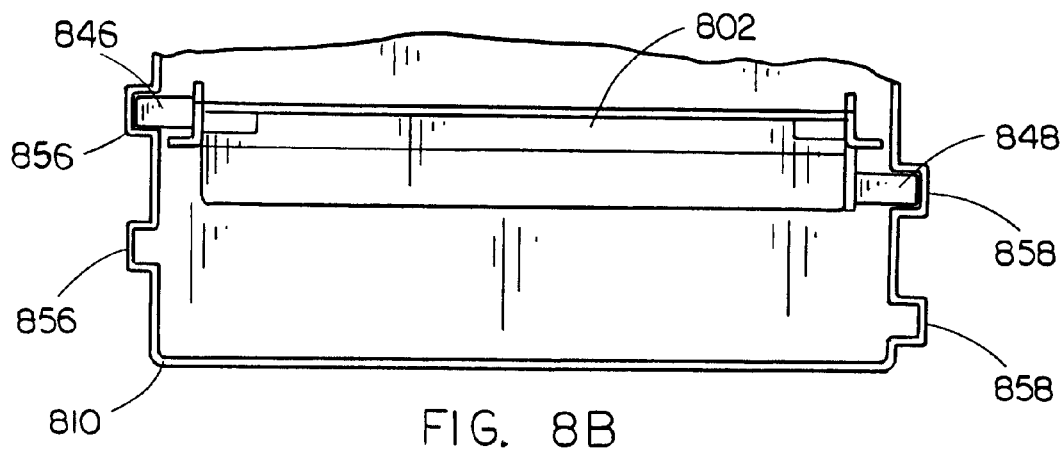
Figure 8C:
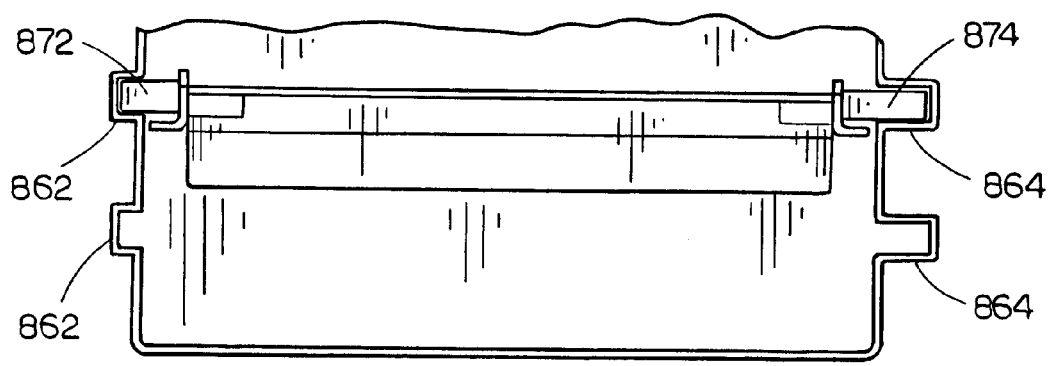
Figure 8D:
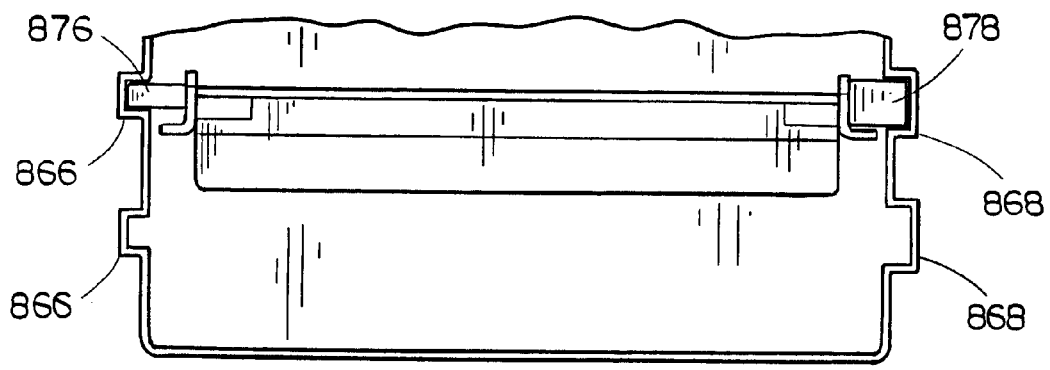

Referring now to FIGS. 8A through 8D another exemplary embodiment of the present invention is shown. In the following descriptions, the term "front" is used to refer to the entry point in a housing, for example, the front of a device as inserted into a housing as shown in FIG. 1. The term "back" is used to refer to the opposite end of the housing from the entry point. The term "height" is used to refer to a perpendicular orientation to the entry point and housing, for example, different heights of guides and guide channels are shown in FIGS. 8B and 8D. The term "width" is defined as perpendicular to height and parallel to the housing, for example, different widths of guides and guide channels are shown in FIG. 8C.

As shown in FIG. 8A, guide channels may be formed so as to promote the proper insertion and orientation of a device. A first guide 842 may be mounted on a device 802 so that the first guide 842 corresponds with a first guide channel 852 and a second guide 844 corresponds with a second guide channel 854. The first guide 842 may be formed in a complementary shape of the first guide channel 852 so that the first guide 842 may be inserted into the first guide channel 852, yet prevent the insertion of a second guide 844 into the first guide channel 852. In this way, the device 802 may only be inserted in the desired manner.

In FIG. 8B, a first guide channel 856 and a second guide channel 858 are strategically placed in the housing 810 so that a first guide 846 and a second guide 848 will indicate to an installer the proper front-to-back orientation of the device 802. Using this arrangement alone, the first guide channel 856 may accept both the first guide 846 and second guide 848, and the second guide channel 858 may accept both the first guide 846 and second guide 848, yet still work to promote the proper front-to-back orientation of the device. Utilizing this arrangement alone, it is possible to insert the device in two different orientations that bias the front of the device 802 toward the front of the housing 810 and the back of the device 802 toward the back of the housing 810.

In FIG. 8C, the width of a first guide 872 and a first guide channel 862 is varied so that first guide 872 will fit into the first guide channel 862 while excluding a second guide 874 from the first guide channel 862.

The height of a guide may also be adjusted to promote proper orientation of a device. In FIG. 8D, the height of a first guide 876 and a first guide channel 866 are adjusted so the first guide channel 866 may accept the first guide 876 and exclude a second guide 878 from insertion into the first guide channel 866. Both guide channels may be formed so as to selectively permit and restrict access yet not depart from the present invention. It should be recognized that the guides and guide channels thereof may be altered by persons of ordinary skill in the art without departing from the spirit and scope of the invention.

Figure 9:
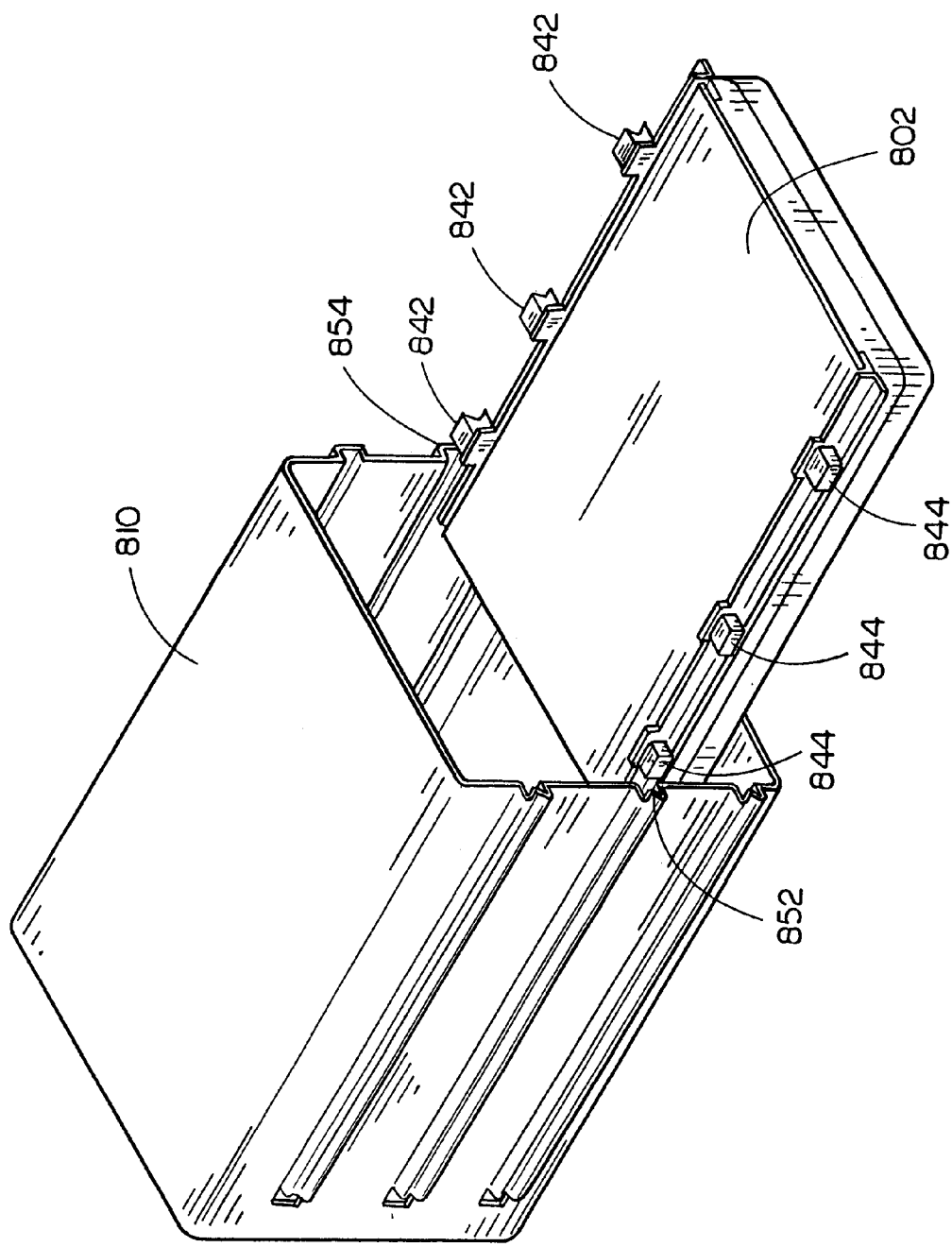
FIG. 9 shows an exemplary embodiment of the present invention wherein the guide channel is formed to selectively prevent the insertion of a guide so as to promote the correct installation of a device.

Referring now to FIG. 9, an attempted incorrect insertion of a device 802 is shown so that the first guide channel 852 is matched up with the second guide 844 (from FIG. 8). The first guide channel 852 may employ any restrictive technique so that the device may not be installed in that orientation. For example, the first guide channel 852 may be formed so as to complement the first guide by variances in height, width, shape, or orientation on the device 802, etc. to restrict the wrongful insertion of the device 802.

Furthermore, a first guide and a second guide may be disposed on different devices (not shown) so only the correct device may be inserted in the guide channel. For instance, if a first guide was mounted on a hard disk drive, and a second guide was connected to a CD-ROM device, it might be desirable to restrict the insertion of the devices to certain positions in a housing. To achieve this goal, the first guide channel may be formed so as to accept the first guide, in this instance connected to the hard disk drive, and exclude all other guides so that only this device may be inserted into that position in the housing. Additionally, the second guide channel may be formed so as to accept second guide, in this instance connected to a CD-ROM device, and exclude all other guides and their attached devices from being installed in that position in the housing.

It is believed that the device mounting and retention mechanism of the present invention and many of its attendant advantages will be understood by the forgoing description, and it will be apparent that various changes may be made in the form, construction and arrangement of the components thereof without departing from the scope and spirit of the invention or without sacrificing all of its material advantages, the form herein before described being merely an explanatory embodiment thereof. It is the intention of the following claims to encompass and include such changes.

What is claimed is:

1. An information handling system, comprising:
    a housing having at least two guide channels and a retention mechanism, the retention mechanism formed as a spring at least partially disposed over one of the at least two guide channels; and
    an electronic device including a plurality of guides disposed thereon in a manner to enable the electronic device to be inserted and removed from the housing by contacting the guide channels with the guides,
    wherein the retention mechanism is flexed away from the housing through contact of a guide of the plurality of guides against the retention mechanism upon insertion of the electronic device in the housing and upon alignment of the guide with a securing portion formed as an indention of the retention mechanism, the securing portion engages the guide thereby securing the electronic device to the housing of the information handling system, the plurality of guides extending through guide channels to protrude through the housing.

2. The information handling system as described in claim 1, wherein the guide is formed as a post.

3. The information handling system as described in claim 1, wherein the electronic device includes a plurality of mounting holes to which the plurality of guides are secured by utilizing screws.

4. The information handling system as described in claim 1, wherein the plurality of guides are substantially circular.

5. The information handling system as described in claim 1, wherein the electronic device includes at least one of a hard drive and a CD-ROM device.

6. The information handling system as described in claim 1, wherein the retention mechanism is formed as an integral part of the housing.

7. The information handling system as described in claim 1, wherein contact of the guide with the retention mechanism through the housing works as a ground of the electronic device to the housing.

8. An information handling system, comprising:
    a housing having at least two guide channels and a retention mechanism; and
    an electronic device including a plurality of guides disposed thereon in a manner to enable the electronic device to be inserted and removed from the housing by contacting the guide channels with the guides, in which the plurality of guides are formed as posts,
    wherein the retention mechanism is flexed substantially parallel to the housing through contact of at least one guide of the plurality of guides against the retention mechanism upon insertion of the electronic device in the housing, and upon alignment of the guide with a securing portion of the retention mechanism, the securing portion engages the guide thereby securing the electronic device to the housing of the information handling system, the plurality of guides extending through guide channels to protrude through the housing.

9. The information handling system as described in claim 8, wherein the guide is substantially circular.

10. The information handling system as described in claim 8, wherein the electronic device includes a plurality of mounting holes to which the plurality of guides are secured by utilizing screws.

11. The information handling system as described in claim 8, wherein the retention mechanism includes a first grasping structure and a second grasping structure to as to engage a guide of the plurality of guides to secure the electronic device to the housing.

12. The information handling system as described in claim 8, wherein the electronic device includes at least one of a hard drive and a CD-ROM device.

13. The information handling system as described in claim 8, wherein the retention mechanism is formed as an integral part of the housing.

14. The information handling system as described in claim 8, wherein contact of the guide with the retention mechanism through the housing works as a ground of the electronic device to the housing.

15. A system, comprising:
    a housing having at least two guide channels and a retention mechanism; and
    an electronic device including a plurality of guides disposed thereon in a manner to enable the electronic device to be inserted and removed from the housing by contacting the guide channels with the guides, the guides formed as posts, the plurality of guides extending through the guide channels to protrude through the housing,
    wherein the retention mechanism is capable of flexible movement so that when contacted by a guide of the plurality of guides of the electronic device, the retention mechanism flexes to permit passage of at least one guide of the plurality of guides and upon passage of the at least one guide, the retention mechanism returns to an original position thereby enabling a securing portion of the retention mechanism to engage the guide, thereby securing the electronic device to the housing.

16. The system as described in claim 15, wherein the electronic device includes a plurality of mounting holes to which the plurality of guides are secured by utilizing screws.

17. The system as described in claim 15, wherein the plurality of guides are substantially circular.

18. The system as described in claim 15, wherein the electronic device includes at least one of a hard drive and a CD-ROM device.

19. The system as described in claim 15, wherein the retention mechanism is formed as an integral part of the housing.

20. The system as described in claim 15, wherein contact of the guide with the retention mechanism through the housing works as a ground of the electronic device to the housing.

* * * * *